(12) United States Patent
Stephenson et al.

(10) Patent No.: US 6,503,781 B2
(45) Date of Patent: Jan. 7, 2003

(54) MOLDED BALL GRID ARRAY

(75) Inventors: William R. Stephenson, Nampa, ID (US); Bret K. Street, Meridian, ID (US); Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/923,191

(22) Filed: Aug. 6, 2001

(65) Prior Publication Data

US 2001/0046724 A1 Nov. 29, 2001

Related U.S. Application Data

(62) Division of application No. 09/568,676, filed on May 11, 2000, now Pat. No. 6,400,574.

(51) Int. Cl.⁷ .................... H01L 21/44; H01L 21/48; H01L 21/50
(52) U.S. Cl. .................... 438/127; 438/124; 438/126
(58) Field of Search .................... 438/124, 126, 438/127

(56) References Cited

U.S. PATENT DOCUMENTS

| 4,807,021 A | 2/1989 | Okumura | 357/75 |
| 5,523,185 A | 6/1996 | Goto | 430/5 |
| 5,841,192 A | 11/1998 | Exposito | 257/701 |
| 5,872,338 A | 2/1999 | Lan et al. | 174/255 |
| 6,020,217 A | 2/2000 | Kuisl et al. | 438/106 |
| 6,144,576 A | 11/2000 | Leddige et al. | 365/63 |
| 6,165,885 A | 12/2000 | Gaynes et al. | 438/612 |
| 6,181,569 B1 | 1/2001 | Chakravorty | 361/761 |

*Primary Examiner*—Kamand Cuneo
*Assistant Examiner*—David A. Zarneke
(74) *Attorney, Agent, or Firm*—Fletcher, Yoder & Van Someren

(57) ABSTRACT

A method and apparatus for encapsulating a BGA package. Specifically, the molded packaging material is configured to provide cups on the backside of the package, opposite the semiconductor device. The cups expose pads on the substrate and are configured to receive solder balls.

32 Claims, 4 Drawing Sheets

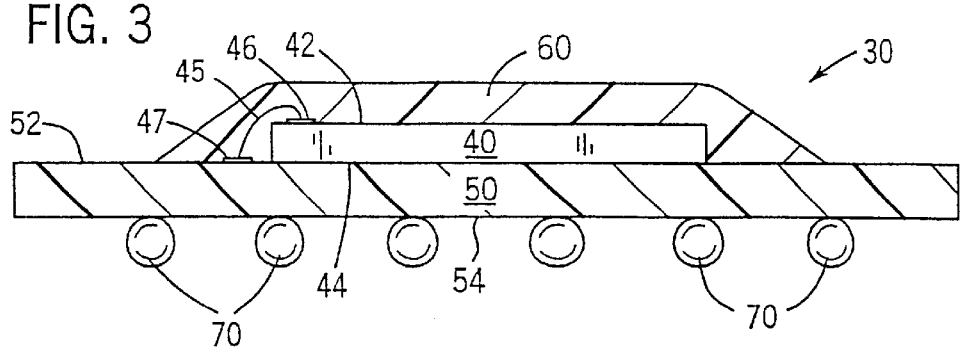
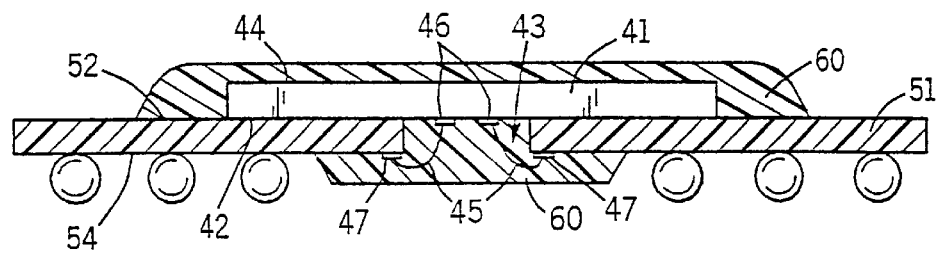
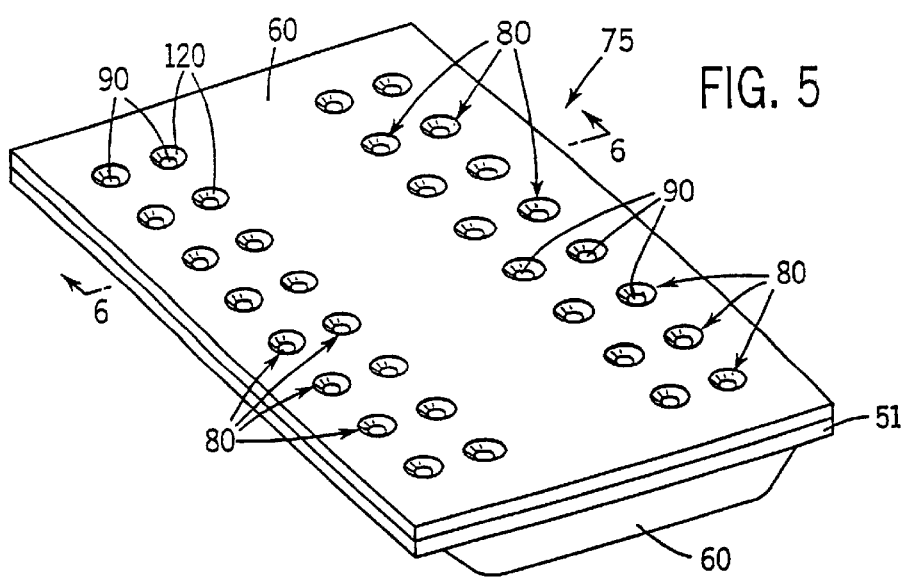

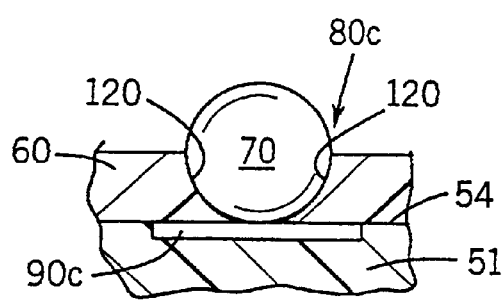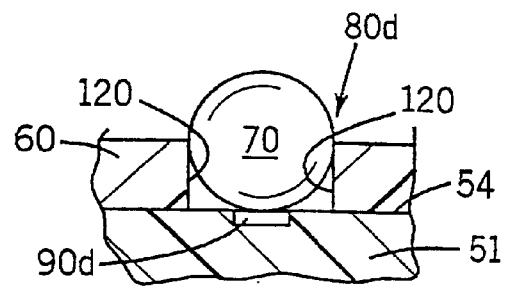
FIG. 7C
FIG. 7D

MOLDED BALL GRID ARRAY

This application is a Divisional of application Ser. No. 09/568,676 filed May 11, 2000 now U.S. Pat. No. 6,400,574.

BACKGROUND OF THE INVENTION

1. Field of the Invention

The present invention relates generally to microelectronic packaging and, more particularly, to a method and apparatus for encapsulating a ball grid array (BGA) in a molding compound.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The packaging of electrical circuits is a key element in the technological development of any device containing electrical components. Several technologies have been developed to provide a means of mounting these electrical components on a surface of a substrate, such as a printed circuit board (PCB). Fine pitch surface mount (FPT), pin grid array (PGA), and ball grid array (BGA) are examples of leading surface mount technologies.

BGA technology offers several advantages over FPT and PGA. Among the most often cited advantages of BGA are: reduced co-planarity problems, since there are no leads; reduced placement problems; reduced paste printing problems; reduced handling damage; smaller size; better electrical and thermal performance; better package yield; better board assembly yield; higher interconnect density; multilayer interconnect options; higher number of 10's for a given footprint; easier extension to multi-chip modules; and faster design-to-production cycle time.

A BGA semiconductor package generally includes a semiconductor chip mounted on the top surface of a substrate. The semiconductor chip may be electrically coupled to the substrate by bond wires. The substrate contains conductive routing which allows the signals to pass from the semiconductor chip on the top side of the substrate, through the substrate, and to pads on the backside of the substrate. A plurality of solder balls are deposited and electrically coupled to the pads on the backside of the substrate to be used as input/output terminals for electrically connecting the substrate to a PCB or other external device.

One problem with conventional BGA packaging is the need to protect the electrical interface between the chip and the substrate. To protect the semiconductor chip and bond wires from external elements such as moisture, dust, or impact, the semiconductor chip is often encapsulated in a molding compound. The implementation of the encapsulation process presents many challenges.

The present invention may address one or more of the problems set forth above.

SUMMARY OF THE INVENTION

Certain aspects commensurate in scope with the disclosed embodiments are set forth below.

It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment of the present invention, there is provided a molded ball grid array including a substrate, a semiconductor chip attached to the substrate and a molding compound disposed on thee substrate. The molding compound is deposited so as to form cups arranged to expose pads on the surface of the substrate.

In another embodiment of the present invention, there is provided a system having a processor and a memory circuit in communication with the processor. The memory circuit includes a substrate, a memory chip attached to the substrate and a molding compound disposed on the substrate. The molding compound is deposited so as to form cups arranged to expose pads on the surface of the substrate.

In yet another embodiment of the present invention, there is provided a memory module. The memory module includes a substrate, memory chips attached to the substrate and a molding compound disposed on the substrate. The molding compound is deposited so as to form cups arranged to expose pads on the surface of the substrate.

In still another embodiment of the present invention, there is provided a system for molding a die in a circuit package. The system includes a first support plate and a second support plate. The second support plate is proximately positioned with respect to the first support plate and has protrusions configured to form cups in the package to align with pads on the die.

In still another embodiment of the present invention, there is provided a method of molding a circuit package including the acts of: disposing the circuit package on a first support plate, the circuit package consisting of a semiconductor device coupled to a substrate; disposing a second support plate on the circuit package such that protrusions extending radially from the second support plate are brought in contact with pads on the substrate; and injecting a molding compound onto the circuit package.

BRIEF DESCRIPTION OF THE DRAWINGS

The foregoing and other advantages and features of the invention will become apparent upon reading the following detailed description and upon reference to the drawings in which:

FIG. 3 illustrates an exemplary encapsulated circuit package;

FIG. 4 illustrates a cross sectional view of a BOC package;

FIG. 5 illustrates an encapsulated circuit package in accordance with the present invention;

FIG. 7C illustrates an alternate embodiment of the solder ball area illustrated in FIG. 6;

FIG. 7D illustrates an alternate embodiment of the solder ball area illustrated in FIG. 6.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
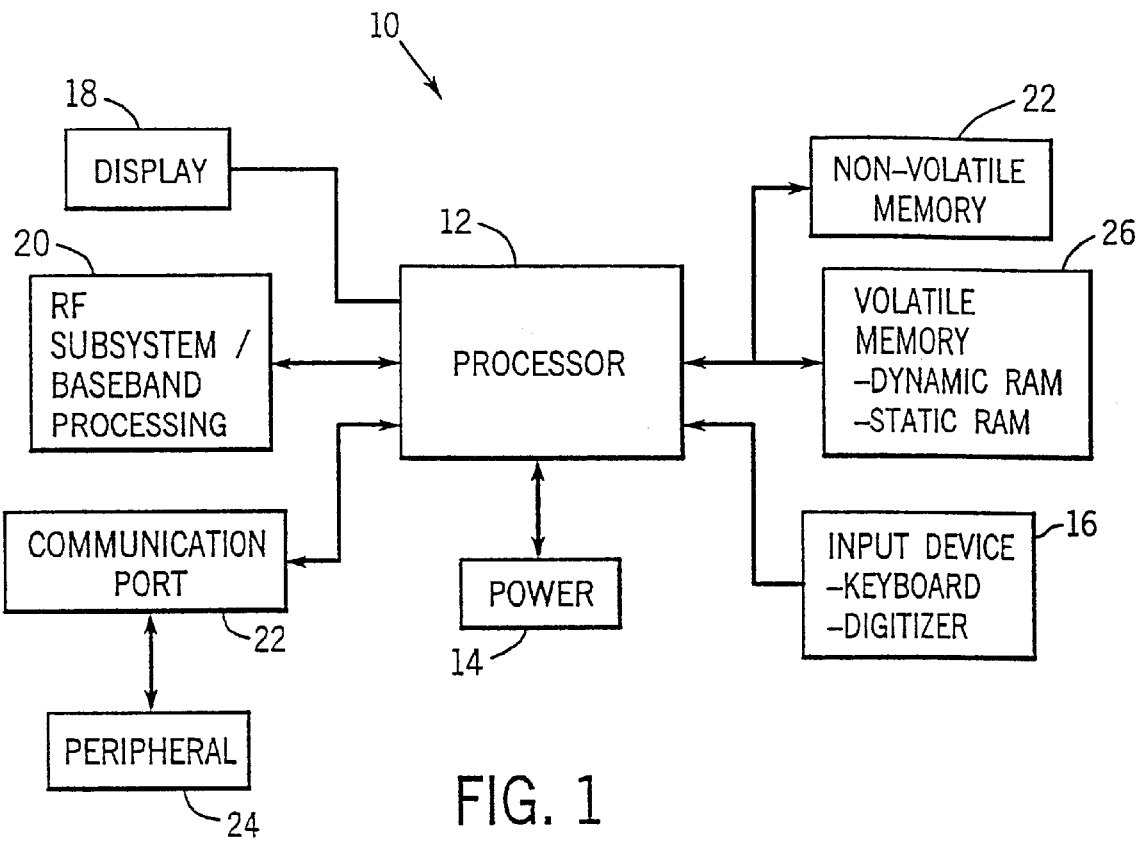
FIG. 1 illustrates block diagram of an exemplary processor-based device in accordance with the present invention.

Turning now to the drawings, and referring initially to FIG. 1, a block diagram depicting an exemplary processor-based device generally designated by the reference numeral 10 is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an AC adapter, so the device may be plugged into a wall outlet, for instance. In fact, the power supply 14 may also include a DC adapter, so that the device can be plugged into a vehicle cigarette lighter, for instance.

Various other devices may be coupled to the processor 12 depending upon the functions that the device 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port may be adapted to be coupled to a peripheral device 24, such as a modem, a printer, or a computer, for instance, or to a network, such as a local area network or the Internet, for instance. Volatile memory 26 and non-volatile memory 28 may also be coupled to the processor 12.

Figure 2:
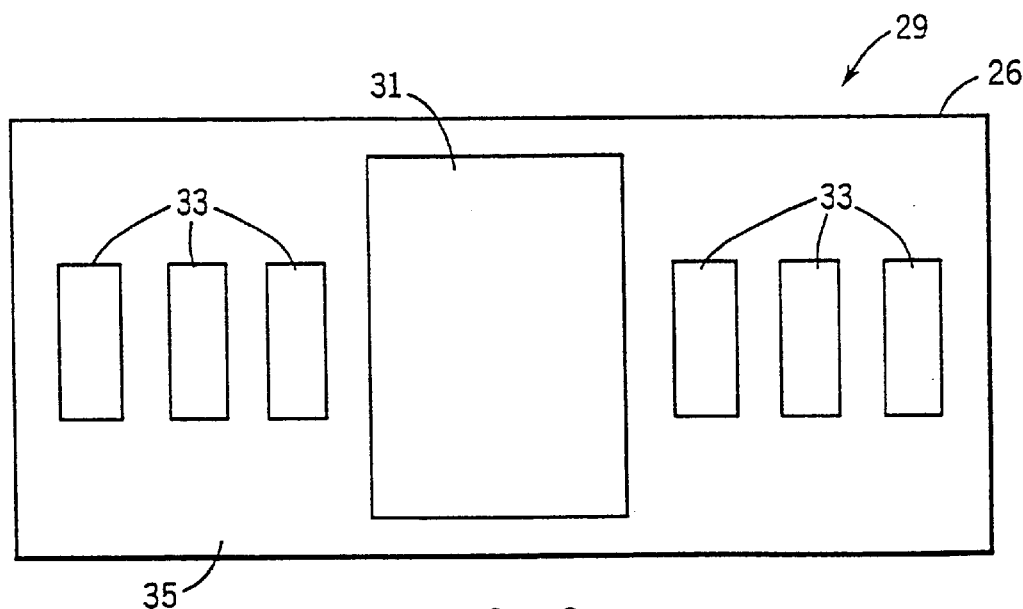
FIG. 2 illustrates an exemplary memory array.

FIG. 2 illustrates a multi-chip memory array 29. For the sake of clarity, elements similar to the elements previously described will be designated by like reference numerals. The memory array 29 may be illustrative of volatile memory 26 or non-volatile memory 28. In this arrangement, a memory controller 31 is coupled to a plurality of memory devices 33. The memory controller 31 and the memory devices 33 are mounted in a planar fashion on the same substrate 35, such as a printed circuit board. Disadvantageously, this planar layout allows for only a limited number of memory devices 33 to be used depending on the surface area of the substrate 35.

FIG. 3 illustrates a partial cross-sectional view depicting an exemplary encapsulated circuit package 30. The circuit package 30 typically includes a semiconductor chip 40, such as a memory die. The semiconductor chip 40 is mounted on a substrate 50 and electrically coupled to the substrate 50 by bond wires 45. Bond wires 45 are attached to bond pads 46 on the first surface 42 of the semiconductor chip 40 and to bond pads 47 on the first surface 52 of the substrate 50. A molding compound 60 is generally used to encapsulate the semiconductor chip 40. The molding compound 60 protects the semiconductor chip 40 and the bond wires 45 from external elements. Terminals, such as pins or solder balls 70, may be disposed on the backside of the substrate 50 so that the circuit package 30 may be electrically coupled to a printed circuit board (PCB) to incorporate the circuit package 30 into a system. The substrate 50 also includes conductive routing and/or vias (not shown) to provide an electrical signal path from the solder pads 47 to the solder balls 70.

Alternately, a board-on-chip (BOC) circuit package may be encapsulated, with molding compound disposed on both surfaces of the substrate 51, as illustrated in FIG. 4. In this embodiment, the semiconductor chip 41 may be mounted with the first surface 42 of the semiconductor chip 41 placed in contact with the first surface 52 of the substrate 51. In this example, a slot 43 is formed in the substrate 51, and bond pads 46 on the first surface 42 of the semiconductor chip 41 are aligned so as to, allow bond wires 45 to be attached to bond pads 46 on the first surface 42 of the semiconductor chip 41, and further attached to bond pads 47 on the second surface 54 of the substrate 51. During the encapsulation process, molding compound 60 may be disposed on the second surface 44 of the semiconductor chip 41 which is not in contact with the substrate 51 and may be disposed on the first surface 52 of the substrate 51. The molding compound 60 may be disposed through the slot 43 in the substrate 51 and on a portion of the second surface 54 of the substrate 51.

FIG. 5 illustrates an encapsulated circuit package 75 in accordance with the present invention. The molding compound 60 is used to encapsulate the entire circuit package 75, including the backside of the circuit package 75. The circuit package 75 is encapsulated with molding compound 60 in such a way as to provide openings in the molding compound 60 to allow the circuit package 75 to be coupled to a printed circuit board. In one example, cups 80 are formed in the molding compound 60. The cups 80 are configured to receive solder balls (not shown) which provide electrical coupling of the circuit package 75 to a printed circuit board. The cups 80 are configured to align with pads 90 which are coupled to the second surface of the substrate 50 contained within the molding compound 60.

Figure 6:
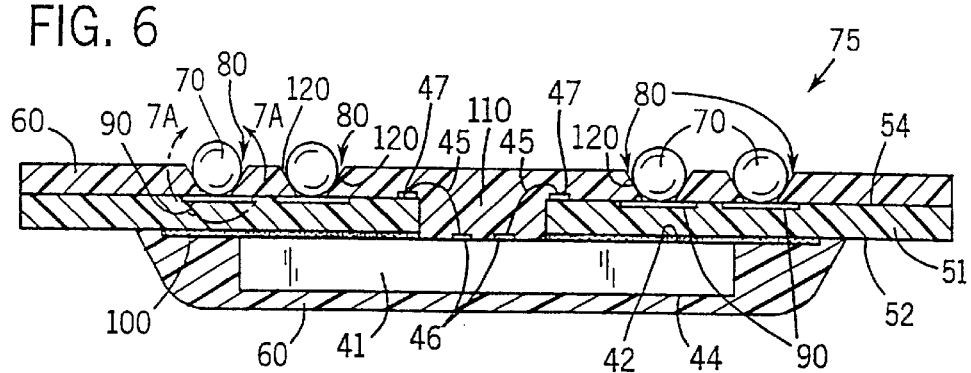
FIG. 6 illustrates a cross-sectional view of an encapsulated circuit package in accordance with the present invention taken along line 6—6.

FIG. 6 illustrates a cross-sectional view of an encapsulated BOC circuit package 75 in accordance with the present invention, taken along line 6—6. As in FIG. 4, a semiconductor chip 41 is typically coupled to the substrate 51 by an adhesive 100, such as a dielectric tape or non-conductive paste. The first surface 42 of the semiconductor chip 41 is coupled to the first surface 52 of the substrate 51 by adhesive 100. The semiconductor chip 41 is electrically coupled to conductors of the substrate 51 by bond wires 45. The bond wires 45 are coupled to bond pads 46 located on the first surface 42 of the semiconductor chip 41 and further coupled to bond pads 47 on the second surface 54 of the substrate 51. In this BOC embodiment, the substrate 51 includes a slot 110 through which the bond wires 45 are attached. The circuit package 75 is encapsulated with the molding compound 60 which is deposited on the second surface 44 of the semiconductor chip 41, the first surface 52 of the substrate 51, through the slot 110 and onto the second surface 54 of the substrate 51. Cup openings 80 are configured to align with solder pads 90 on the second surface 54 of the substrate 51. The cups 80 advantageously have tapered walls 120 which facilitate alignment of the solder balls 70 with the solder pads 90.

Figure 7A:
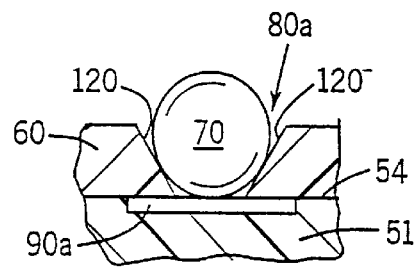
FIG. 7A illustrates an enlarged view of the solder ball area illustrated in FIG. 6.

FIG. 7A illustrates an enlarged view of the solder ball area illustrated in FIG. 6. The cup 80a in the molding compound 60 is configured such that the base of the cup is smaller than the solder pad 90a. Thus, the solder mask used to dispense the solder balls 70 determine the solder ball 70 location. The tapered walls 120 allow for proper alignment of the solder ball 70 over the solder pad 90a. Alternately, the cup 80a may be a hemisphere sized to hold a solder ball 70 as illustrated in FIG. 7C. Further, the cup 80a may be cylindrical in shape as illustrated in FIG. 7D. The solder pad 90a is coupled to the second surface 54 of the substrate 51 to provide electrical coupling of the solder balls 70 to the substrate 51.

Figure 7B:
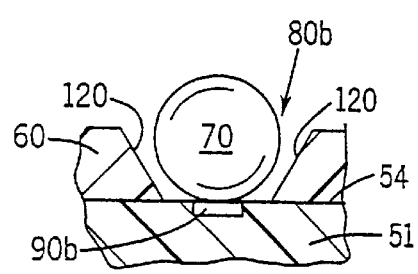
FIG. 7B illustrates an alternate embodiment of the solder ball area illustrated in FIG. 6.

FIG. 7B illustrates an alternate embodiment of the solder ball area illustrated in FIG. 6. Here, the cup 80b contained within the molding compound 60 is configured such that the opening is larger than the solder pad 90b. While the tapered walls 120 in the cup 80b may direct the alignment of the solder ball 70 within the cup 80b, it is the location of the solder pad 90b which actually determines the exact placement of the solder ball 70, because the solder ball 70 will be attracted to the wetted solder pad 90b during the re-flow process that couples the solder ball 70 to the substrate 51. Again, solder pad 90b is coupled to the second surface 54 of substrate 51 to provide for electrical coupling between the solder ball 70 and the substrate 51.

Figure 8:
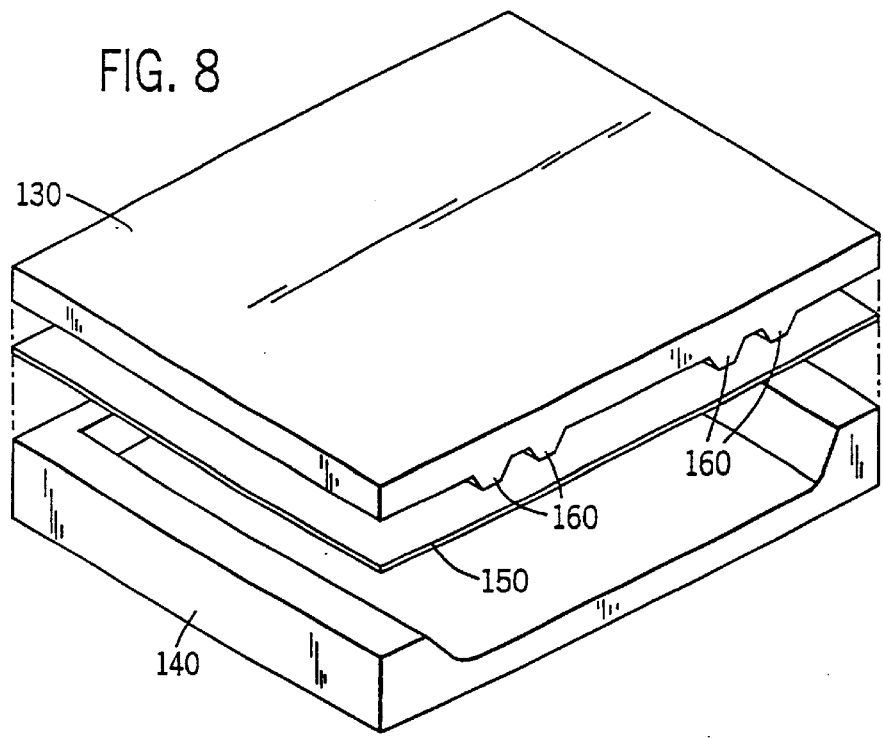
FIG. 8 illustrates an exploded view of an exemplary mold and circuit package used to create an encapsulated circuit package in accordance with the present invention.

FIG. 8 illustrates an exploded view of a mold 125, which may include an upper mold 130 and a lower mold 140 used to create an encapsulated circuit package in accordance with the present invention. During the encapsulation process, the circuit package 75 is placed between the upper mold 130 and the lower mold 140. A release liner 150 may be used to provide separation of the circuit package 75 from the upper mold 130 after the encapsulation process is complete. The upper mold 130 includes a plurality of protrusions 160 which are brought in contact with the solder pads (not shown) on the second surface 54 of substrate 51. The protrusions 160 may be tapered to create the tapered walls of the cups 80, as shown in FIGS. 5–7B. During the molding process, the protrusions 160 of the upper mold 130 are brought in contact with the solder pads 90 (separated by release liner 150, if used). The second surface 54 of the substrate 51 is brought in contact with the upper mold 130, while the first surface 52 of the substrate 50 is brought in contact with the lower mold 140. A molding compound is then injected into an opening (not shown) in the molds 130 and 140. Once the molding compound hardens, the circuit package 75 is separated from the molds 130 and 140. The resulting circuit package 75 is encapsulated and includes the alignment cups used for solder ball deposition as described above.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of molding a circuit package comprising the acts of:
   (a) disposing a first mold adjacent a circuit package comprising a semiconductor device coupled to a substrate;
   (b) disposing a second mold adjacent the circuit package such that protrusions extending from the second mold are brought in contact with pads on the substrate; and
   (c) injecting a molding compound between the first and second molds and over at least a portion of the circuit package.

2. The method, as set forth in claim 1, further comprising the act of: disposing a release liner between the second mold and the circuit package prior to injecting the molding compound.

3. The method, as set forth in claim 1, wherein the protrusions are tapered.

4. The method, as set forth in claim 1, wherein the protrusions are cylindrical.

5. The method, as set forth in claim 1, wherein the protrusions are hemispherical.

6. The method, as set forth in claim 1, wherein the protrusions are sized to completely cover the pads on the substrate.

7. The method, as set forth in claim 1, wherein the protrusions are sized to partially cover the pads on the substrate.

8. The method, as set forth in claim 1, wherein the semiconductor device comprises a memory device.

9. A method of manufacturing a molded ball grid array comprising the acts of:
   disposing a first mold adjacent a circuit package, the circuit package comprising a substrate and a semiconductor chip, wherein the substrate comprises a first surface operatively coupled to the semiconductor chip and a second surface having a plurality of pads thereon;
   disposing a second mold comprising a plurality of protrusions adjacent the circuit package such that the plurality of protrusions are brought in contact with the plurality of pads and such that the first mold and second mold enclose at least a portion of the circuit package; and
   filling the mold with a molding compound.

10. The method, as set forth in claim 9, further comprising the act of:
    disposing a release liner between the second mold and the circuit package prior to filling the mold.

11. The method, as set forth in claim 9, wherein the plurality of protrusions are tapered.

12. The method, as set forth in claim 9, wherein the plurality of protrusions are cylindrical.

13. The method, as set forth in claim 9, wherein the plurality of protrusions are hemispherical.

14. The method, as set forth in claim 9, wherein the plurality of protrusions are sized to completely cover the plurality of pads on the substrate.

15. The method, as set forth in claim 9, wherein the plurality of protrusions are sized to partially cover the plurality of pads on the substrate.

16. The method, as set forth in claim 9, wherein the semiconductor chip comprises a memory device.

17. A method of molding a substrate in a circuit package, wherein the circuit package comprises a semiconductor chip coupled to the substrate, and wherein the substrate comprises a plurality of pads, comprising the acts of:

disposing the circuit package within a mold, the mold comprising a first half and a second half, the first half having a plurality of protrusions;

moving the first half and the second half together such that the plurality of protrusions contacts the plurality of pads; and at least partially filling the mold with a molding compound such that at least a portion of the substrate is covered by the molding compound.

18. The method, as set forth in claim 17, further comprising the act of:

disposing a release liner between the first half and the circuit package prior to at least partially filling the mold.

19. The method, as set forth in claim 17, wherein the plurality of protrusions are tapered.

20. The method, as set forth in claim 17, wherein the plurality of protrusions are cylindrical.

21. The method, as set forth in claim 17, wherein the plurality of protrusions are hemispherical.

22. The method, as set forth in claim 17, wherein the plurality of protrusions are sized to completely cover the plurality of pads on the substrate.

23. The method, as set forth in claim 17, wherein the plurality of protrusions are sized to partially cover the plurality of pads on the substrate.

24. The method, as set forth in claim 17, wherein the semiconductor chip comprises a memory device.

25. A method for molding a plurality of openings on a circuit package, the circuit package comprising a semiconductor device and a substrate, the substrate comprising a first side, a second side, and a plurality of pads coupled to the first side, the semiconductor device being coupled to the second side of the substrate, the method comprising the acts of:

disposing the circuit package within a mold, the mold comprising a plurality of protrusions, such that the plurality of protrusions contact the plurality of pads; and at least partially filling the mold with a molding compound such that at least a portion of the substrate is covered by the molding compound.

26. The method, as set forth in claim 25, further comprising:

disposing a release liner between the plurality of protrusions and the circuit package prior to at least partially filling the mold.

27. The method, as set forth in claim 25, wherein the plurality of protrusions are tapered.

28. The method, as set forth in claim 25, wherein the plurality of protrusions are cylindrical.

29. The method, as set forth in claim 25, wherein the plurality of protrusions are hemispherical.

30. The method, as set forth in claim 25, wherein the plurality of protrusions are sized to completely cover the plurality of pads on the substrate.

31. The method, as set forth in claim 25, wherein the plurality of protrusions are sized to partially cover the plurality of pads on the substrate.

32. The method, as set forth in claim 25, wherein the semiconductor device comprises a memory device.

* * * * *